(12) United States Patent
Ishida et al.

(10) Patent No.: US 7,092,278 B2
(45) Date of Patent: Aug. 15, 2006

(54) MEMORY DEVICE

(75) Inventors: Minoru Ishida, Tokyo (JP); Katsuhisa Aratani, Chiba (JP); Akira Kouchiyama, Kanagawa (JP); Tomohito Tsushima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/071,082

(22) Filed: Mar. 3, 2005

(65) Prior Publication Data

US 2005/0195634 A1 Sep. 8, 2005

(30) Foreign Application Priority Data

Mar. 5, 2004 (JP) ............................ P2004-062131

(51) Int. Cl.
*G11C 11/00* (2006.01)
*G11C 19/08* (2006.01)
*G11C 7/02* (2006.01)

(52) U.S. Cl. .......................... 365/148; 365/34; 365/207
(58) Field of Classification Search ................ 365/148, 365/34

See application file for complete search history.

(56) References Cited

U.S. PATENT DOCUMENTS

| 5,793,697 | A | 8/1998 | Scheuerlein |
| 6,426,907 | B1 | 7/2002 | Hoenigschmid |
| 6,665,216 | B1 | 12/2003 | Ho et al. |
| 6,965,521 | B1* | 11/2005 | Li et al. ...................... 365/148 |
| 2002/0154531 | A1 | 10/2002 | Lowrey et al. |
| 2005/0098811 | A1* | 5/2005 | Ogiwara ...................... 257/295 |

FOREIGN PATENT DOCUMENTS

| EP | 1 496 518 | 1/2005 |
| WO | WO 03/079463 | 9/2003 |
| WO | WO 03/088254 | 10/2003 |

* cited by examiner

*Primary Examiner*—Amir Zarabian
*Assistant Examiner*—Anthan Tran
(74) *Attorney, Agent, or Firm*—Frommer Lawrence & Haug LLP.; William S. Frommer (57) ABSTRACT

Data reading can be easily and precisely performed by setting specific conditions in writing into a selected memory cell. A memory cell has a structure, in which an interelectrode material layer is sandwiched between a first electrode and a second electrode. Data is stored by a change in a resistance value between the first electrode and the second electrode. The resistance value when a memory element is in a high resistance state is expressed as R_mem_high; the resistance value when the memory element is in a low resistance state is expressed as R_mem_low1; the resistance value of a load circuit is expressed as R_load; the reading voltage is expressed as Vread by setting the voltage of a second power supply line to the reference voltage; and the threshold voltage is expressed as Vth_critical. In writing data into the memory cell, the low resistance state is created so that these parameters satisfy specific relations. The load circuit is formed by an element having the same structure as of the memory element of the memory cell.

8 Claims, 4 Drawing Sheets

MEMORY DEVICE

BACKGROUND OF THE INVENTION

1. Field of the Invention

The present invention relates to a memory device for writing data (information) by changing electrical characteristics of an interelectrode material layer between two electrodes.

2. Description of the Related Art

Conventionally, as a memory element capable of being easily formed in a simple structure, a microelectronic programmable element has been known (Japanese Translations of PCT International Application Publication No. 2002-536840). In the element, data is written by applying a given voltage to ionize silver (Ag) contained in an interelectrode material layer between two electrodes, moving the ionized silver to form a conduction path for electrons and the like, and thereby changing electrical resistance between the foregoing electrodes.

In the element, as a matter of convenience, a state that resistance between the two electrodes is high before applying a voltage is a storage state of data "0," and a state that resistance between the two electrodes is low as a result that metal ions are diffused in the direction of the opposite electrode due to application of voltage is a storage state of data "1." Further, an operation to change the element from the high resistance state to the low resistance state is called writing operation, and an operation to return the element from the low resistance state to the high resistance state is called erasing operation.

In the conventional memory element, it is disclosed that a resistance value of the conduction path, which comes into the low resistance state after writing is about 200 Ω, and a resistance value of the interelectrode material layer, which comes into the high resistance state after erasing is 1 M (mega) Ω or more. Further, it is described that a resistance value between the low resistance state of about 200 Ω and the high resistance state of 1 M (mega) Ω or more can be arbitrarily created by arbitrarily limiting a current value applied to the memory element in writing.

However, it is not allowed that the resistance value created by writing can be unconditionally large as long as, for example, a resistance change rate due to writing is sufficient.

That is, in the conventional memory element, it is necessary that when a writing voltage is applied, a voltage (threshold voltage) at which the resistance change is generated is 0.2 V, and when the written data is read, a voltage to be applied (reading voltage) is less than 0.2 V in order not to generate unintended resistance change for the memory element. Therefore, for example, when a memory element, in which a state of a high resistance value (storage state of data "0") is 10 MΩ and a state of a low resistance value (storage state of data "1") is 1 MΩ is constructed, even if a voltage of 0.2 V at the maximum is applied, flowing currents are only 0.02 μA and 0.2 μA, respectively. When these currents are flowed to load resistance of, for example, 1 KΩ to convert to a voltage, a voltage difference between the two is only 0.2 mV. However, in the related art, it is not easy to read the written data by detecting such a small voltage difference.

SUMMARY OF THE INVENTION

In view of such a problem, it is an object of the invention to provide a memory device capable of easily and precisely reading written data by specifying conditions in writing.

The memory device according to the invention is a memory device, comprising: a memory cell array, wherein a memory cell constructed from a memory element capable of storing a plurality of data by changing a resistance value into at least two states of high resistance and low resistance and a transistor for controlling access to the memory element is arranged in a plurality of columns and in a plurality of rows; a control means for controlling access to the memory cell, which has a row address decoder connected to a plurality of memory cells in the memory cell array through a word line and a column address decoder connected to the plurality of memory cells through a bit line; a power supply means for applying a given (reading) voltage to the memory cell, which includes a first and a second power supply lines; a sense amplifier for detecting data stored in the memory cell; and a load circuit for converting a current flowing to the bit line through the memory cell in reading to a voltage, wherein when the resistance value of the memory element is in a high resistance state is expressed as R_mem_high; the resistance value of the memory element is in a low resistance state is expressed as R_mem_low1; the resistance value of the load circuit is expressed as R_load; the reading voltage applied between the first power supply line and the second power supply line for reading by setting the voltage of the second power supply line to the reference voltage is expressed as Vread; and the threshold voltage at which the change of the resistance value of the memory element is generated is expressed as Vth_critical, the low resistance state is created so that relations of the following Formulas (1) and (2) are satisfied in writing data into the memory cell.

$$R\_mem\_low1 <= \{Vread * R\_mem\_high/(R\_mem\_high + R\_load) - 0.01\} * R\_load / \{Vread * R\_mem\_high/(R\_mem\_high + R\_load) * R\_load/R\_mem\_high + M \ (M \text{ is a given value such as } 0.01.)\} \quad \text{Formula (1)}$$

$$Vread*R\_mem\_high/(R\_mem\_high+R\_load) <= Vth\_critical \quad \text{Formula (2)}$$

As a memory element constructing the memory cell, a memory element comprising: a first electrode; a second electrode arranged oppositely to the first electrode; and an interelectrode material layer capable of conducting electrons or ions, which is provided between the first electrode and the second electrode and containing a redox reaction active material, wherein a voltage is applied to the first electrode and the second electrode, and thereby electrical characteristics between the first electrode and the second electrode are changed and information is recorded is used.

Instead of the foregoing Formulas (1) and (2), the following Formula (3) can be applied.

$$R\_mem\_low1<=\{Vth\_critical-M\}*R\_load/\{Vth\_critical*R\_load/R\_mem\_high+M(M: \text{given value})\} \quad \text{Formula (3)}$$

In the memory device according to the invention, the written data can be precisely read by satisfying the relations of the foregoing Formulas (1) and (2), or the foregoing Formula (3) in writing into the selected memory cell.

According to the memory device of the invention, specific conditions are set in writing into the selected memory cell. Therefore, data reading can be easily and precisely performed.

Other and further objects, features and advantages of the invention will appear more fully from the following description.

DETAILED DESCRIPTION OF THE PREFERRED EMBODIMENT

An embodiment of the invention will be hereinafter described in detail with reference to the drawings.

Figure 1A:
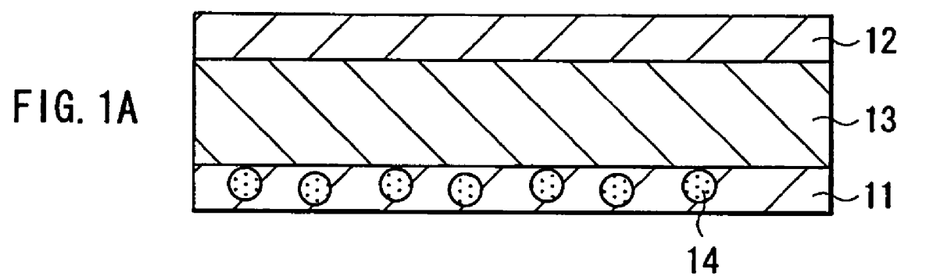
FIGS. 1A and 1B are cross sections showing constructions of a memory element according to an embodiment of the invention.

FIG. 1A shows a construction of a substantial part of a memory device according to a first embodiment of the invention. Though not shown, this memory device is constructed from a plurality of memory elements arranged, for example, in a state of a matrix. One memory element has a structure, in which an interelectrode material layer 13 is sandwiched between a pair of electrodes 11 (first electrode) and 12 (second electrode) oppositely arranged over a substrate 10. Further, the memory element comprises a voltage application means (not shown) for applying a given voltage to the electrode 11 and the electrode 12. A periphery of the interelectrode material layer 13 between the electrode 11 and the electrode 12 is surrounded by an interlayer insulating film (not shown). For each of the plurality of memory elements, an active device (transistor) (not shown) for controlling electrical access to each element is correspondingly arranged, and thereby a memory cell 100 is constructed.

The interelectrode material layer 13 is located between the electrode 11 and the electrode 12, and has ion conductivity. For example, the interelectrode material layer 13 is made of a material having a parent material of an amorphous thin film containing a chalcogenide material such as oxygen (O), sulfur (S), selenium (Se), and tellurium (Te); and at least one from the group consisting of germanium (Ge), silicon (Si), antimony (Sb), and indium (In), for example, GeSbTeGd. A film thickness thereof is, for example, 50 nm. The interelectrode material layer 13 is formed by, for example, sputtering method, and then provided with annealing treatment in the mixed atmosphere of nitrogen and oxygen, for example.

The electrode 11 is made of, for example, silver (Ag) or copper (Cu). Meanwhile, the electrode 12 is made of, for example, a titanium tungsten (TiW) layer having a film thickness of 100 nm. Each film thickness of the electrode 11 and the electrode 12 can be a film thickness as used for a general semiconductor device. Here, for example, the electrode 11 has a film thickness of 50 nm, and the electrode 12 has a film thickness of 100 nm.

Figure 1B:
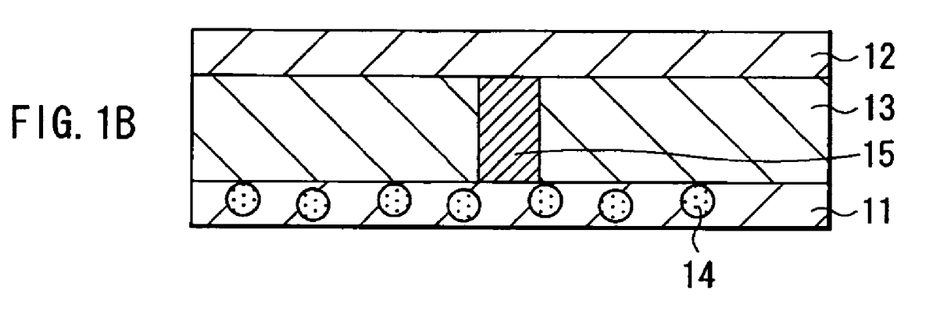

In this embodiment, a redox reaction active material (redox active species) 14 is contained, for example, in the electrode 11 in a state that the redox reaction active material is dissolved or dispersed in the electrode 11. When data is written (or erased), this redox reaction active material 14 is oxidized or reduced according to a state of voltage application to the electrode 11 and the electrode 12. In the result, as shown in FIG. 1B, a conduction path 15 for electrons or ions is formed or disappeared between the electrode 11 and the electrode 12.

As the redox reaction active material 14, for example, a metal such as silver (Ag), copper (Cu), nickel (Ni), cobalt (Co), chromium (Cr), titanium (Ti), tantalum (Ta), iron (Fe), aluminum (Al), and vanadium (V); and a semiconductor such as silicon (Si) and germanium (Ge) can be cited. Further, a reductant ($HxWO_3$) of tungstic oxide ($WO_3$) and an oxide of vanadium (V) have the similar function, and therefore can be used as the redox reaction active material 14. Cations obtained by oxidizing the redox reaction active material 14 will be hereinafter referred to as elution ions. In the case of silver, the cation (elution ion) is monovalent $Ag^+$.

Here, the redox reaction active material 14 is contained in the electrode 11. However, the redox reaction active material 14 can be contained in the electrode 12 or the interelectrode material layer 13.

In the memory device of this embodiment, a given voltage is applied to the electrode 11 and the electrode 12 in the state shown in FIG. 1A. Thereby, as shown in FIG. 1B, the active species is ionized and elutes from the elution electrode (electrode 11) side containing the redox reaction active material 14, and moves in the direction of the opposite electrode (electrode 12), and then receives electrons from the electrode 12 side and is deposited again, or is deposited while recombining with electrons flowing from the electrode 12 side through the interelectrode material layer 13 in the high resistance state and provided between the two electrodes 11 and 12. In the result, the conduction path 15, through which electrons or ions are conducted from the electrode 12 side to the electrode 11 side is formed, and data is written. Such a basic mechanism is similar to of the conventional memory devices.

Next, descriptions will be given of features of the memory device of this embodiment in contrast to that of the foregoing conventional memory device.

First, for the conventional memory device, mechanisms of operations of data writing and data erasing and important items then will be described in detail. In this memory device, a state that resistance between the two electrodes is high before applying a voltage is called "off state" (data "0"), and a state that resistance between the two electrodes is low as a result that metal ions are diffused in the direction of the opposite electrode due to application of voltage is called "on state" (data "1"). An operation to change the element from the high resistance state to the low resistance state is called writing operation, and an operation to return the element from the low resistance state to the high resistance state is called erasing operation.

As a structure of this memory device, in the foregoing Japanese Translations of PCT International Application Publication No. 2002-536840, in addition to the structure, in which only the interelectrode material layer made of an ion conductor exists between the two electrodes, a structure, in which a barrier layer exists along with the interelectrode material layer between the two electrodes is disclosed. In these examples, voltages applied for writing and erasing and items generated then are as follows:

(1) Writing operation is generated when a voltage equal to or more than a certain threshold voltage is applied.
(2) The threshold voltage at which writing is generated is approximately equal to redox potential of the system.
(3) The foregoing threshold voltage is several hundred mV, and is probably from 200 mV to 300 mV.
(4) When a voltage equal to or more than the foregoing threshold is applied, ions are moved in the direction of the opposite electrode, and an electrical deposit (conduction path) is formed in the vicinity of the opposite electrode. In the result, resistance between the two electrodes becomes the low state.
(5) Reading operation is generated when a voltage equal to or more than the threshold voltage in writing operation is applied in the opposite direction of writing.
(6) When the voltage equal to or more than the foregoing threshold is applied, the deposited electrical matter is dissolved and disappeared. In the result, resistance between the two electrodes returns to the high state.

In the case of the structure, in which the barrier layer exists, a graph of current and voltage characteristics with a threshold of 1.4 V is disclosed. Meanwhile, it is described that erasing operation is performed by giving a sufficient erasing voltage equal to or more than the threshold voltage. This means that it is required to apply a voltage equal to or more than the voltage in the case of no barrier layer. Further, in these examples, a resistance value in the low resistance state after writing is about 200 Ω, and a resistance value in the high resistance state after erasing is 1 MΩ or more.

Further, in these examples, as mechanisms of writing and erasing, the following is disclosed. In the case of writing operation, as a voltage to make the active species into cations, the voltage equal to or more than the foregoing threshold voltage is given to the electrode containing the redox reaction active species (redox active species). In the result, the redox reaction active species becomes cations and elutes from the electrode. The eluting cations are diffused toward the opposite electrode, receive electrons from the opposite electrode side, are deposited, and form the conduction path. Thereby, the element becomes the low resistance state, and data is written. In the case of erasing operation, as a voltage to make the redox reaction active species, which has been deposited to form the conduction path, into cations, a voltage equal to or more than the foregoing threshold voltage in the opposite direction is given to the foregoing opposite electrode. In the result, the redox reaction active species, which has formed the conduction path, elutes, and thereby the conduction path is disappeared. Therefore, the element returns to the high resistance state. This is a state that the foregoing written data is erased to return to the state before writing. The above is the operation mechanism of the conventional memory device.

Further, in this memory device, it is disclosed that the foregoing resistance value between the low resistance state of about 200 Ω and the high resistance state of 1 MΩ or more can be arbitrarily created by arbitrarily limiting a current value flowed to the memory element in writing as the following resistance value according to a relation of the following Formula (4).

$$R_{on} = V_t / I_{lim} \quad \text{Formula (4)}$$

Where $R_{on}$ represents a resistance value obtained as a result of performing writing process, $V_t$ represents a threshold voltage of writing process, and $I_{lim}$ represents the maximum current flowing during writing operation.

In a general memory device such as a DRAM (Dynamic Random Access Memory), one memory device comprises a plurality of unit memory cells. The plurality of unit memory cells (also simply referred to as a unit cell or a memory cell) generally forms a memory cell array, in which the memory cells are aligned in a plurality of columns and in a plurality of rows. In order to select one memory cell existing in a given row and a given column from this memory cell array to write data into the element thereof or to read data from the element thereof, it is essential that each memory cell comprises a word line for selecting a given row, a bit line for selecting a given column, and an access transistor for controlling access to the memory cell together.

Here, the word line has a role to select a given row from the memory cell array, and also has a role as a control line for turning on/off the access transistor. Meanwhile, the bit line has a role to select a given column from the memory cell array, and also has a role as a data line in the case of writing data into the memory cell and reading data from the memory cell. In addition, each memory cell requires a power supply line for supplying a power supply voltage and a ground voltage to the memory cell.

Figure 2:
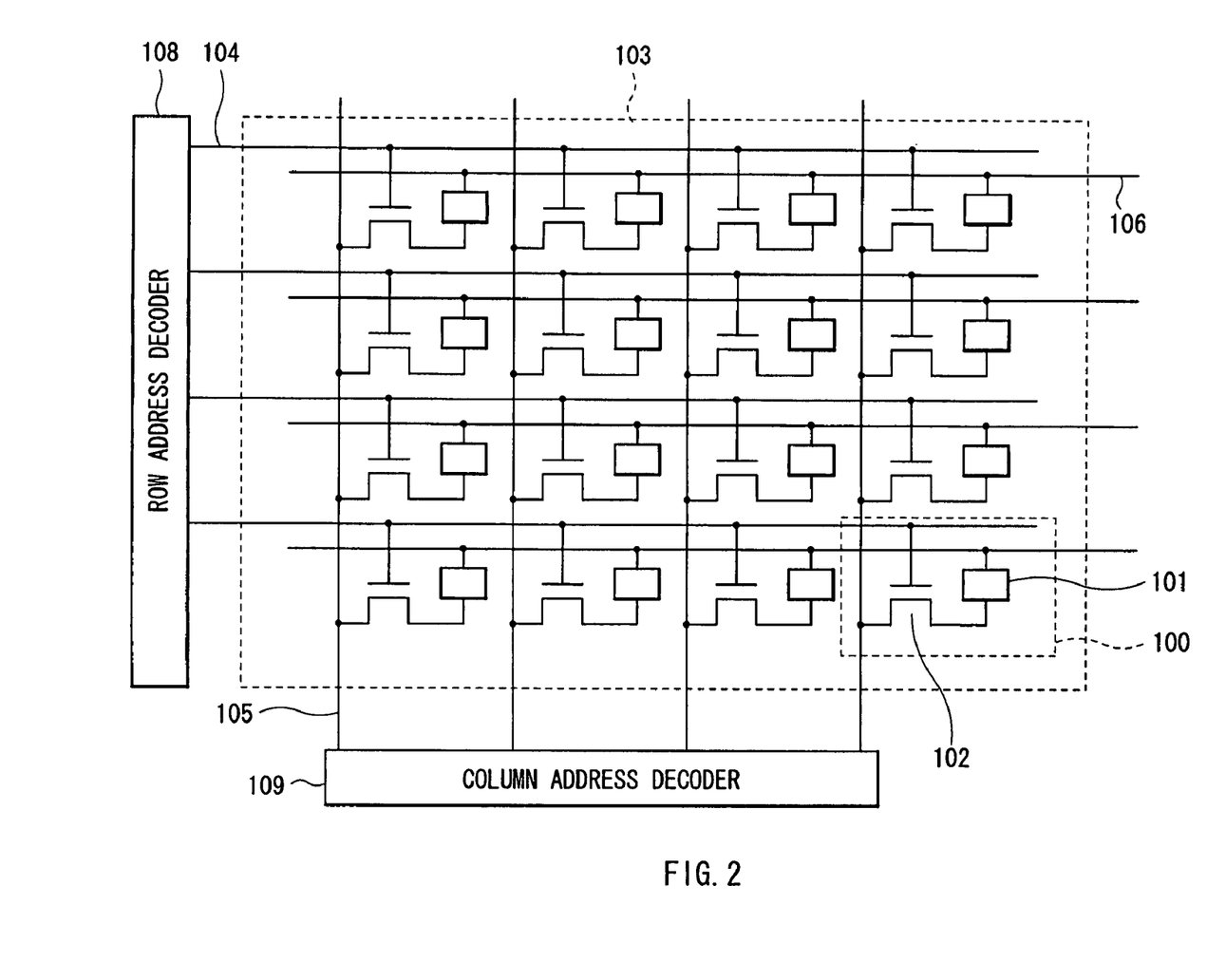
FIG. 2 is a circuit construction view of a memory device using the memory element of FIGS. 1A and 1B.

The memory device of this embodiment also has a construction as above similarly to of the conventional memory device. FIG. 2 shows an outline thereof. A memory cell 100 is constructed from a memory element 101 shown in FIGS. 1A and 1B and an access transistor 102. A memory cell array 103, in which the memory cells 100 are aligned in a plurality of columns and in a plurality of rows is formed. Each memory cell 100 is connected to a word line 104, a bit line 105, a first power supply line 106, and a second power supply line 107 (refer to FIG. 3). Each word line 104 is connected to a row address decoder 108. The bit line 105 is connected to a column address decoder 109. The memory cell 100 targeted for writing, erasing, or reading is selected from the memory cell array 103 by the row address decoder 108 and the column address decoder 109. Further, each bit line 105 is connected to an after-mentioned sense amplifier 112. Data read from the selected memory cell 100 is detected by the sense amplifier 112.

Writing data into this memory device is performed by applying a given voltage to the memory cell 100 to be selected. That is, a column to which the memory cell 100 targeted for writing is connected is selected from the memory cell array 103, and a voltage for data writing is applied to the bit line 105 thereof. Meanwhile, a voltage at which data writing is not generated even when the voltage is applied to the memory cell is applied to other bit lines. Concurrently, a row to which the memory cell 100 targeted for writing is connected is selected, a control voltage at which the access transistor 102 of the memory cell 100 is turned on and data writing into the memory cell 100 is enabled is applied to the word line 104 thereof. Meanwhile, a voltage for controlling the access transistor 102 so that data writing into the memory cells connected to other word lines is not performed is applied to such other word lines. Thereby, inexpectant data writing into unselected memory cells can be prevented, while data writing can be performed by giving a desired data writing voltage only to the selected memory cell 100.

The foregoing case has been described on the assumption that the writing voltage is applied to the bit line 105 and the voltage lower than the writing voltage (for example, ground voltage) is applied to the second power supply line 107. However, it is possible that the memory element has an opposite resistance structure of the foregoing (that is, the low resistance state is "0," and the high resistance state is "1"), and thereby writing is performed by applying a writing voltage to the power supply line and applying lower potential than potential of the power supply line (for example, ground voltage) to the bit line to which the memory cell targeted for writing is connected.

Further, in the foregoing example, writing is performed into one memory cell 100. However, it is possible to concurrently perform writing into a plurality of memory cells by contriving a voltage applied to each memory cell 100. In the foregoing example, descriptions have been given of data writing into the memory cell and controlling the access transistor by applying the voltage. However, according to structures of the element and the access transistor to be used, it is possible to adopt a construction, in which data writing into the memory cell 100 and controlling the access transistor 102 are enabled by applying current.

For reading the data written in the memory cell 100, access is made to the memory cell 100 by a method similar to of the foregoing writing operation, and a voltage lower than the voltage at which data writing is generated is applied to the cell. The data stored in the memory cell can be read by a flowing current resulting from applying the reading voltage, or converting such a flowing current to a voltage. For erasing the data stored in the memory cell, access is made to the cell by a method similar to of the foregoing writing operation, and a voltage is applied in the opposite direction of the writing voltage.

Figure 3:
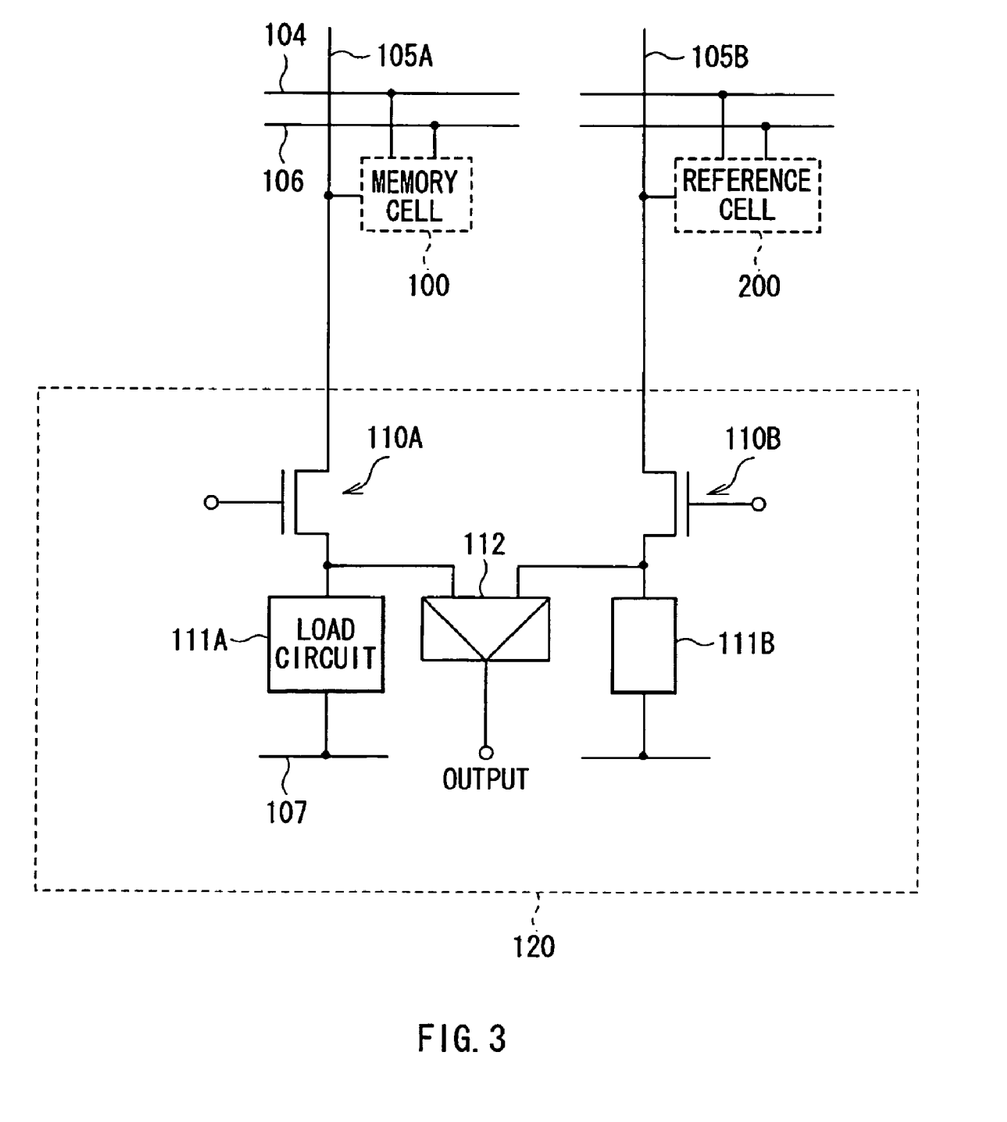
FIG. 3 is a construction view of a reading circuit in the memory device of FIG. 2.

Next, requirements for detecting written data (that is, a change of a resistance value of the memory element) will be described. FIG. 3 shows a construction of a reading circuit 120 for reading data from the memory cell 100. Here, the memory cell 100 and a reference cell 200 are respectively constructed from the memory element 101 and the access transistor 102 shown in FIG. 2. The access transistor 102 in the memory cell 100 is connected to the second power supply line 107 via a switching transistor 110A and a load circuit 111A through a bit line 105A. The access transistor 102 in the reference cell 200 is connected to the second power supply line 107 via a switching transistor 110B and a load circuit 111B through a bit line 105B. The respective memory elements 101 in the memory cell 100 and the reference cell 200 are connected to the first power supply line 106.

The load circuits 111A and 111B are intended to convert a cell current flowing in this system in reading to a voltage. In this embodiment, these load circuits 111A and 111B are also constructed by connecting the memory element 101 shown in FIGS. 1A and 1B to the bit line 105A or 105B in series or in parallel. A connection point between the switching transistor 110A and the load circuit 111A, and a connection point between the switching transistor 110B and the load circuit 111B are respectively connected to an input terminal of the sense amplifier 112. In the sense amplifier 112, a reading signal, that is the change of the resistance value of the memory cell 100 (writing data) is detected by comparing with a resistance value of the reference cell 200.

In the circuit shown in FIG. 2, the memory element 101 is connected to the first power supply line 106 side. However, needless to say, it is possible to adopt a construction that the memory element 101 and the access transistor 102 are arranged oppositely to the foregoing, and the access transistor 102 is connected to the first power supply line 106 side. Further, the reading circuit 120 shown in FIG. 3 shows a bare minimum of simplified construction for determining whether the data retained in the memory element 101 is "0" or "1," and contents of the circuit are not limited to this example. Further, as potential giving to the power supply line, it is possible to adopt a construction that the first power supply line 106 is set to positive potential, from where a current flows to the sense amplifier 112, or it is possible to adopt a construction that the first power supply line 106 is set to ground potential or negative potential, and a current flows from the sense amplifier 112 to the first power supply line 106.

Next, conditions required for detecting the change of the resistance value due to writing and operations of the memory element of this embodiment for realizing the conditions in the foregoing system will be described.

Currently, a product, in which an AD converter circuit for A/D (analog/digital) converting an analog input signal of 1.8 V to a digital signal of 10 bits, that is, 1,024 gradations is incorporated in a system LSI (Large Scale Integrated Circuit) as one function is broadly in the marketplace. In this case, a voltage width per one gradation is 1.8 mV, and a voltage difference of 1.8 mV is detected, which is converted to the digital signal.

In view of the foregoing, in the memory device of this embodiment, if a voltage difference of 10 mV as a reading signal voltage difference is generated between the bit line 105A to which the memory cell 100 targeted for reading is connected and the bit line 105B to which the reference cell 200 is connected, it is sufficiently possible to amplify such a voltage difference in the sense amplifier 112 to determine a value of the input signal.

In this embodiment, the reading voltage difference of, for example, 10 mV is generated between the bit line 105A of the memory cell 100 and the bit line 105B of the reference cell 200 by setting the following conditions.

First, among four resistance components constructing resistance R_total of the reading circuit 120, that is, R_mem_low1 (resistance component of the memory element 101), R_on_access (resistance component of the access transistor 102), R_on_sw (resistance component of the switching transistors 110A and 110B), and R_load (resistance component of the load circuits 111A and 111B), R_on_access and R_on_sw can be ignored since their sizes are small as described above. Further, as described above, when reading is performed, it is necessary that a voltage applied to the memory element is not over each threshold voltage, no matter what the voltage is applied in the same direction as of writing or in the same direction as of reading. The threshold voltage in this case is expressed as Vth_critical.

In the system, in which the resistance value of the memory element 101 can be R_mem_high or less, required conditions to prevent a voltage more than Vth_critical from being applied to the memory element 101 are that a voltage applied to the cell, in which the resistance value is in a state of R_mem_high is equal to or less than the foregoing Vth_critical.

Figure 4:
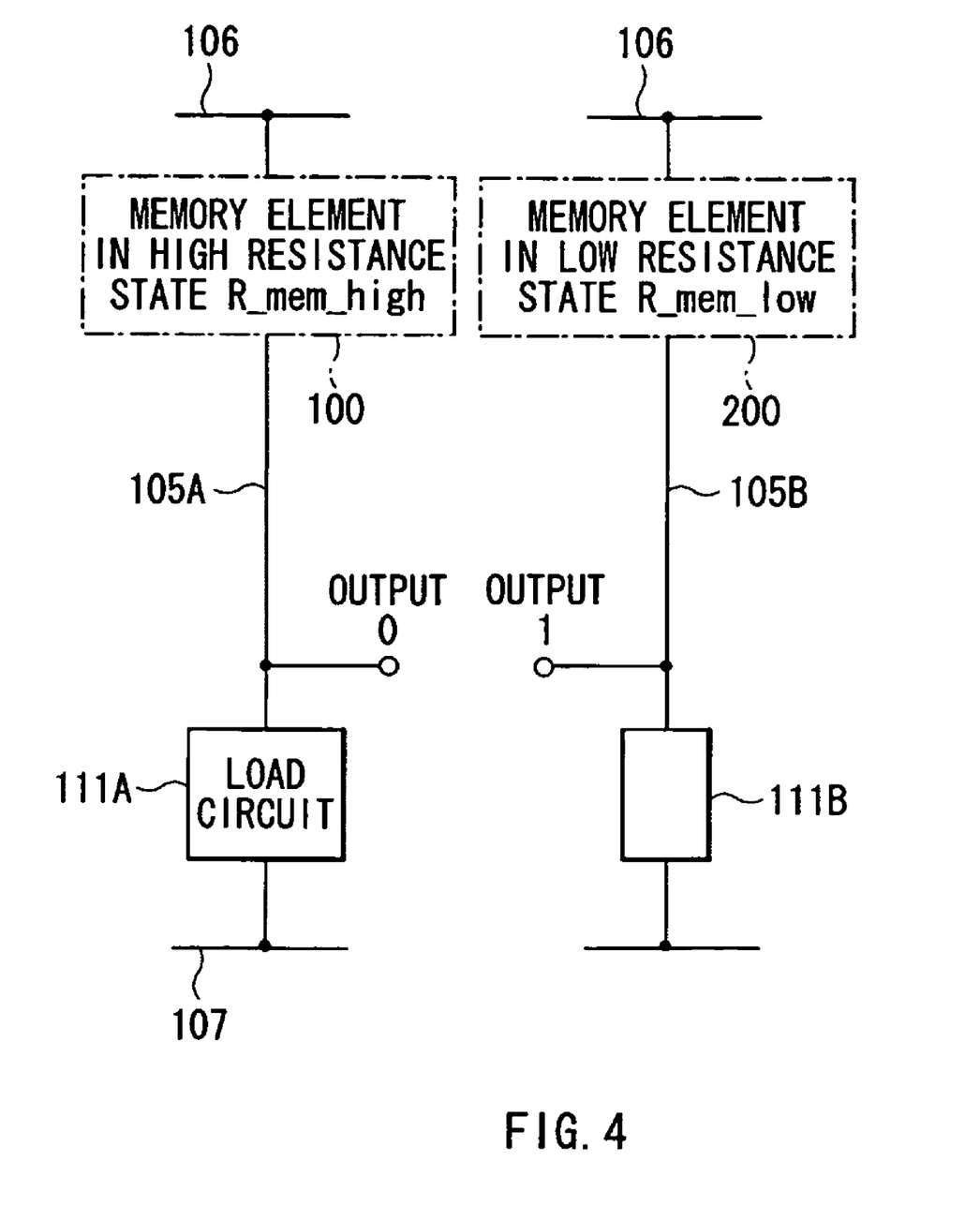
FIG. 4 is a view for explaining operations of the reading circuit.

Therefore, as shown in FIG. 4, considering the case, in which the resistance value of the memory element in the memory cell 100 targeted for reading is in the high resistance state, and the resistance value of the memory element in the reference cell 200 is a value different from the foregoing value, that is, in the low resistance state, the required conditions for generating the reading voltage difference of 10 mV between the bit line 105A of the memory cell 100 and the bit line 105B of the reference cell 200 can be derived.

In FIG. 4, when the resistance value of the memory element in the memory cell 100 in the high resistance state is expressed as R_mem_high; the resistance value of the memory element in the reference cell 200 in the low resistance state is expressed as R_mem_low1; the resistance value of the load circuits 111A and 111B for converting the cell current flowing in this system in reading to a voltage is expressed as R_load; the reading voltage applied between the first power supply line 106 and the second power supply line 107 for reading by setting the voltage of the second power supply line 107 to the reference voltage is expressed as Vread; the voltage applied to the memory element when the reading voltage Vread is applied in the circuit, in which the memory element is in the high resistance state R_mem_high is expressed as Vr_mem0; the voltage applied to the load circuits 111A and 111B when the reading voltage Vread is applied is expressed as Vr_load0; a voltage output to an output terminal 0 by setting the voltage of the second power supply line 107 to the reference voltage is expressed as Vout0; the voltage applied to the memory element when the reading voltage Vread is applied in the circuit, in which the memory element is in the low resistance state R_mem_low1 is expressed as Vr_mem1; the voltage applied to the load circuits 111A and 111B when the reading voltage Vread is applied is expressed as Vr_load1; the voltage output to an output terminal 1 by setting the voltage of the second power supply line 107 to the reference voltage is expressed as Vout1; and the voltage difference between Vout1 and Vout0, which is obtained by Vout1-Vout0 is expressed as Vout_diff, the following Formula (5) to Formula (7) are realized.

$$Vout0 = Vread * R\_load/(R\_mem\_high + R\_load) \quad \text{Formula (5)}$$

$$Vout1 = Vread * R\_load/(R\_mem\_low1 + R\_load) \quad \text{Formula (6)}$$

$$Vout\_diff = Vout1 - Vout0 = Vread*\{R\_load/(R\_mem\_low1 + R\_load) - R\_load/(R\_mem\_high + R\_load)\} \quad \text{Formula (7)}$$

Therefore, conditions for obtaining 10 mV or more of the voltage difference Vout_diff between Vout0 and Vout1 are as the following Formula (8).

$$Vread*\{R\_load/(R\_mem\_low1 + R\_load) - R\_load/(R\_mem\_high + R\_load)\} \geq 0.01 \quad \text{Formula (8)}$$

That is, $$R\_mem\_low1 \leq \{Vread * R\_mem\_high/(R\_mem\_high + R\_load) - 0.01\} * R\_load/\{Vread * R\_mem\_high/(R\_mem\_high + R\_load) * R\_load/R\_mem\_high + 0.01\} \quad \text{Formula (9)}$$

Meanwhile, as mentioned above, when reading is performed, it is necessary that a voltage applied to the memory element is not over each threshold voltage Vth_critical, no matter what the voltage is applied in the same direction as of writing or in the same direction as of reading. Required conditions to prevent a voltage more than the foregoing Vth_critical from being applied to the memory element in the system, in which the resistance value of the memory element can be equal to or less than R_mem_high are that the voltage applied to the cell, in which the resistance value is R_mem_high is equal to or less than the foregoing Vth_critical. Therefore, it is necessary to satisfy the following relations Formulas (10) and (11) as well.

$$Vr\_mem0 \leq Vth\_critical \quad \text{Formula (10)}$$

That is, $$Vread*R\_mem\_high/(R\_mem\_high+R\_load) \leq Vth\_critical \quad \text{Formula (11)}$$

The foregoing can be summarized as follows. In the memory device of this embodiment, the written data can be precisely read by performing writing process so that the following relational Formulas (12) and (13) are satisfied.

$$R\_mem\_low1 \leq \{Vread * R\_mem\_high/(R\_mem\_high + R\_load) - 0.01\} * R\_load/\{Vread * R\_mem\_high/(R\_mem\_high + R\_load) * R\_load/R\_mem\_high + 0.01\} \quad \text{Formula (12)}$$

$$Vread*R\_mem\_high/(R\_mem\_high+R\_load) \leq Vth\_critical \quad \text{Formula (13)}$$

Further, the written data can be also precisely read by performing writing operation so that the following relation is satisfied.

$$R\_mem\_low1 \leq \{Vth\_critical - 0.01\} * R\_load/\{Vth\_critical * R\_load/R\_mem\_high + 0.01\} \quad \text{Formula (14)}$$

To take an example, Vth_critical is about 0.2 V. In this case, for example, in the case of R_load=100 KΩ and R_mem_high=100 KΩ, the written data can be precisely read by performing writing operation for the memory element so that R_mem_low1≤90 KΩ can be obtained.

Similarly, the written data can be precisely read by performing writing operation for the memory element so that R_mem_low1≤63 KΩ can be obtained in the case of R_load=10 KΩ and R_mem_high=100 KΩ; R_mem_low1≤16 KΩ can be obtained in the case of R_load=1 KΩ and R_mem_high=100 KΩ; R_mem_low1≤9.4 KΩ can be obtained in the case of R_load=100 KΩ and R_mem_high=10 KΩ; R_mem_low1≤9 KΩ can be obtained in the case of R_load=10 KΩ and R_mem_high=10 KΩ; and R_mem_low1≤6 KΩ can be obtained in the case of R_load=1 KΩ and R_mem_high=10 KΩ.

In the memory device of this embodiment, in writing, the voltage equal to or more than the threshold voltage at which resistance change is generated is applied to the memory element. Meanwhile, in reading, reading process is performed by applying the voltage equal to or less than the foregoing threshold voltage to the memory element. Therefore, in writing, more cell current flows than in reading. In view of operations as electronic equipment and from the perspective that an operation current is reduced, it is preferable that the cell current is smaller, that is, it is preferable that the resistance value R_mem_low1 of the memory element in the low resistance state after writing is larger.

As described above, for example, when a memory device, in which the resistance value R_load of the load circuits 111A and 111B for converting the cell current flowing in the system in reading to a voltage is 100 KΩ, the resistance value R_mem_high when the memory element is in the high resistance state is 100 KΩ, and the resistance value R_mem_low1 when the memory element is in the low resistance state is 90 KΩ is formed, the memory device with small operation current can be realized. However, in this case, as mentioned above, in order to precisely read the data stored in the memory element, it is necessary that the resistance value R_load of the load circuits 111A and 111B are equal to or more than 100 KΩ.

If the foregoing is tried to be formed by using a diffusion layer (silicon substrate layer) with sheet resistance of, for example, about 100 Ω resulting from doping of impurities as performed in general semiconductor devices, for example, an area being 130 nm wide and 130 µm long is required even if the design rule of 130 nm generation is used. Further, a circuit area also becomes large, resulting in high manufacturing costs of the memory device.

For resolving this problem, in this embodiment, the load circuits 111A and 111B for converting the cell current flowing in the system in reading from the memory element 101 to a voltage are formed by connecting in series or in parallel one or a plurality of elements having the same structure as of the memory element 101 shown in FIGS. 1A and 1B per one bit line 105.

For example, assume that a size of the memory element is 130 nm×130 nm. If the resistance value R_mem_high when the memory element is in the high resistance state is 100 KΩ and the resistance value R_mem_low1 when the memory element is in the low resistance state is 90 KΩ, load resistance of 100 KΩ or 90 KΩ can be formed with the size of 130 nm×130 nm. This area is significantly small compared to the case that the memory element is formed by using the diffusion layer (silicon substrate layer) with sheet resistance of, for example, about 100 Ω resulting from doping impurities as mentioned above. Further, it becomes possible to form a given resistance value by connecting the plurality of foregoing memory elements in series or in parallel.

However, when the memory element 101 of FIG. 2 is used for the load circuits 111A and 111B as above, it is necessary that in reading the data stored in the memory element 101, a reading voltage is set so that a voltage equal to or more than the threshold voltage at which resistance change is generated is not applied not only to the memory element of the memory cell 100 but also to the memory element of the reference cell 200.

The memory device of the invention is effective for devices such as a mobile computer driven by a battery, requiring small power consumption. In particular, the memory device of the invention can be utilized for a nonvolatile programmable device.

Obviously many modifications and variations of the present invention are possible in the light of the above teachings. It is therefore to be understood that within the scope of the appended claims the invention may be practiced otherwise than as specifically described.

What is claimed is:

1. A memory device, comprising:
a memory cell array, wherein a memory cell constructed from a memory element capable of storing a plurality of data by changing a resistance value into at least two states of high resistance and low resistance and a transistor for controlling access to the memory element is arranged in a plurality of columns and in a plurality of rows;
a control means for controlling access to the memory cell, which has a row address decoder connected to a plurality of memory cells in the memory cell array through a word line and a column address decoder connected to the plurality of memory cells through a bit line;
a power supply means for applying a given (reading) voltage to the memory cell, which includes a first and a second power supply lines;
a sense amplifier for detecting data stored in the memory cell; and
a load circuit for converting a current flowing to the bit line through the memory cell in reading to a voltage, wherein when the resistance value of the memory element is in a high resistance state is expressed as R_mem_high; the resistance value of the memory element is in a low resistance state is expressed as R_mem_low1;

the resistance value of the load circuit is expressed as R_load; the reading voltage applied between the first power supply line and the second power supply line for reading by setting the voltage of the second power supply line to the reference voltage is expressed as Vread; and the threshold voltage at which the change of the resistance value of the memory element is generated is expressed as Vth_critical, the low resistance state is created so that relations of the following Formulas (1) and (2) are satisfied in writing data into the memory cell $$R\_mem\_low1 <= \{Vread * R\_mem\_high/(R\_mem\_high + R\_load) - 0.01\} * R\_load/\{Vread * R\_mem\_high/(R\_mem\_high + R\_load) * R\_load/R\_mem\_high + M \ (M: \text{given value})\}$$

Formula (1)

$$Vread * R\_mem\_high/(R\_mem\_high + R\_load) <= Vth\_critical.$$

Fromual (2)

2. A memory device according to claim 1, wherein the M is 0.01.

3. A memory device according to claim 1, wherein the load circuit is constructed by connecting an element having the same structure as of the memory element to the bit line in series or in parallel.

4. A memory device according to claim 1, wherein the memory element comprises: a first electrode; a second electrode arranged oppositely to the first electrode; and an interelectrode material layer capable of conducting electrons or ions, which is provided between the first electrode and the second electrode and contains a redox reaction active material, wherein
a voltage is applied to the first electrode and the second electrode, and thereby electrical characteristics between the first electrode and the second electrode are changed and information is recorded.

5. A memory device, comprising:
a memory cell array, wherein a memory cell constructed from a memory element capable of storing a plurality of data by changing a resistance value into at least two states of high resistance and low resistance and a transistor for controlling access to the memory element is arranged in a plurality of columns and in a plurality of rows;
a control means for controlling access to the memory cell, which has a row address decoder connected to a plurality of memory cells in the memory cell array through a word line and a column address decoder connected to the plurality of memory cells through a bit line;
a power supply means for applying a given (reading) voltage to the memory cell, which includes a first and a second power supply lines;
a sense amplifier for detecting data stored in the memory cell; and a load circuit for converting a current flowing to the bit line through the memory cell in reading to a voltage, wherein when the resistance value of the memory element in a high resistance state is expressed as R_mem_high; the resistance value of the memory element in a low resistance state is expressed as R_mem_low1; the resistance value of the load circuit is expressed as R_load; the reading voltage applied between the first power supply line and the second power supply line for reading by setting the voltage of the second power supply line to the reference voltage is expressed as Vread; and the threshold voltage at which the change of the resistance value of the memory element is generated is expressed as Vth_critical, the low resistance state is created so that a relation of the following Formula (3) is satisfied in writing data into the memory cell $$R\_mem\_low1 <= \{Vth\_critical-M\}*R\_load/ \{Vth\_critical*R\_high+M \text{ (M: given value)}\}. \quad \text{Formula (3)}$$

6. A memory device according to claim 5, wherein the M is 0.01.

7. A memory device according to claim 5, wherein the load circuit is constructed by connecting an element having the same structure as of the memory element to the bit line in series or in parallel.

8. A memory device according to claim 5, wherein the memory element comprises: a first electrode; a second electrode arranged oppositely to the first electrode; and an interelectrode material layer capable of conducting electrons or ions, which is provided between the first electrode and the second electrode and contains a redox reaction active material, wherein a voltage is applied to the first electrode and the second electrode, and thereby electrical characteristics between the first electrode and the second electrode are changed and information is recorded.

* * * * *